(12) United States Patent
Liu (10) Patent No.: US 9,804,720 B2
(45) Date of Patent: Oct. 31, 2017

(54) OLED TOUCH DISPLAY PANEL

(71) Applicant: EVERDISPLAY OPTRONICS (SHANGHAI) LIMITED, Shanghai (CN)

(72) Inventor: Chih-hung Liu, Shanghai (CN)

(73) Assignee: EVERDISPLAY OPTRONICS (SHANGHAI) LIMITED, Shanghai (CN)

(*) Notice: Subject to any disclaimer, the term of this patent is extended or adjusted under 35 U.S.C. 154(b) by 177 days.

(21) Appl. No.: 14/935,903

(22) Filed: Nov. 9, 2015

(65) Prior Publication Data

US 2016/0274693 A1 Sep. 22, 2016

(30) Foreign Application Priority Data

Mar. 17, 2015 (CN) .......................... 2015 1 0117483

(51) Int. Cl.
| | |
|---|---|
| G06F 3/044 | (2006.01) |
| G09G 3/32 | (2016.01) |
| G06F 3/041 | (2006.01) |
| G09G 3/3266 | (2016.01) |
| G09G 3/3225 | (2016.01) |
| H01L 27/32 | (2006.01) |

(52) U.S. Cl.
CPC ............ G06F 3/044 (2013.01); G06F 3/0412 (2013.01); G09G 3/3225 (2013.01); G09G 3/3266 (2013.01); H01L 27/323 (2013.01); *G06F 2203/04102* (2013.01); *G06F 2203/04103* (2013.01); *G06F 2203/04104* (2013.01); *G06F 2203/04112* (2013.01)

(58) Field of Classification Search
CPC ......... G06F 2203/04112; G06F 3/0412; G06F 3/044; G09G 3/3225; G09G 3/3266; H01L 27/323
See application file for complete search history.

(56) References Cited

U.S. PATENT DOCUMENTS

| | | | |
|---|---|---|---|
| 9,046,955 B1* | 6/2015 | Lee .................... | G06F 3/0412 |
| 9,638,949 B1* | 5/2017 | Kim .................... | G02F 1/13338 |
| 2014/0203262 A1* | 7/2014 | Kwak ................ | G09G 3/3233 |
| | | | 257/40 |
| 2015/0364507 A1* | 12/2015 | Won ..................... | G06F 3/044 |
| | | | 257/43 |
| 2015/0378390 A1* | 12/2015 | Liu ..................... | G06F 3/0412 |
| | | | 345/173 |
| 2016/0188083 A1* | 6/2016 | Shi ....................... | G06F 3/044 |
| | | | 345/174 |
| 2016/0357313 A1* | 12/2016 | Yang .................... | G06F 3/044 |

* cited by examiner

*Primary Examiner* — Seokyun Moon
*Assistant Examiner* — Peijie Shen
(74) *Attorney, Agent, or Firm* — Scully, Scott, Murphy & Presser, P.C.

(57) ABSTRACT

The present disclosure provides an OLED touch display panel, including a TFT array substrate, an OLED element and a touch array. The touch array includes: a first touch line extending along a first direction and disposed in the same layer with a gate line; a second touch line extending along a second direction, intersecting with the first touch line and disposed in the same layer with a data line; and a touch sensing electrode disposed in the same layer with a lower electrode of the OLED element, spaced from the lower electrode and electrically connected with the second touch line via a contact hole in a planarizing layer. The OLED touch display panel has better display effect and/or accuracy of touch detection.

11 Claims, 7 Drawing Sheets

OLED TOUCH DISPLAY PANEL

CROSS-REFERENCE TO RELATED APPLICATIONS

The present application is based upon and claims priority to Chinese Patent Application No. 201510117483.8, filed Mar. 17, 2015, the entire contents of which are incorporated herein by reference.

TECHNICAL FIELD

The present disclosure generally relates to an Organic Light Emitting Diode (OLED) display panel, and more particularly, to a capacitive in-cell OLED touch display panel and a method for manufacturing the same.

BACKGROUND

The Active Matrix Organic Light Emitting Diode (AMO-LED), as a new generation of display technology, has advantages such as self-illumination, wide viewing angle, high contrast, low power consumption, high response speed, high resolution, full color and thinness. Accordingly, AMO-LED has a prospect of becoming one of the mainstream display technologies in future.

Presently, touch display panels are widely equipped in various electronic devices such as mobile phones and tablet computers, to allow manipulation of the devices through touch sensing. Accordingly, OLED touch display panels obtained by integration of touch components and OLED display panels begin to enter into the markets.

The touch components may be integrated into an OLED panel through methods such as in-cell, on-cell, One Glass Solution (OGS), Glass/Glass (G/G), Glass/Film (GFF), and so on.

Figure 1:
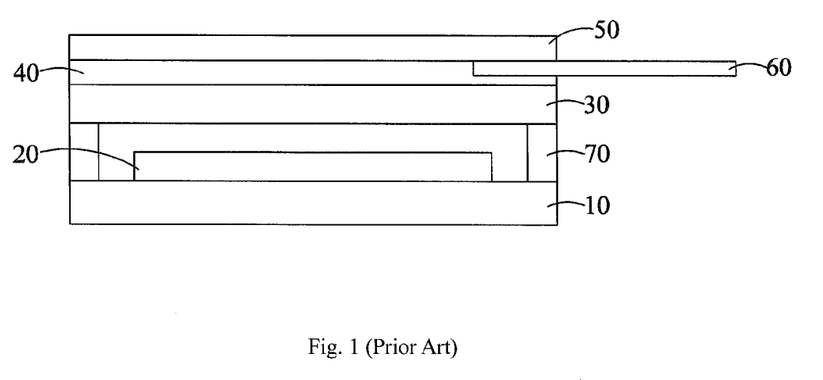
FIG. 1 illustratively shows a solution for integrating a touch component into an OLED panel.

As shown in FIG. 1, in accordance with the G/G solution, a touch display panel includes a Thin Film Transistor (TFT) substrate 10, an OLED element 20 formed on the TFT substrate 10, a package cover 30, an encapsulant 70 disposed between the TFT substrate 10 and the package cover 30 to adhere them hermetically, a touch component 40 disposed on the package cover 30, a protection cover 50 disposed on the touch component 40, and a Flexible Printed Circuit Board (FPC) 60 electrically connected with the touch component 40. In such integration solution, the touch component is adhered to the outside of the package cover, and thus the numbers of processes and components are increased. Further, the protection cover 50 is additionally needed, and thus the thickness of the touch panel is increased, which is adverse to super thinness of the touch panel.

Figure 2:
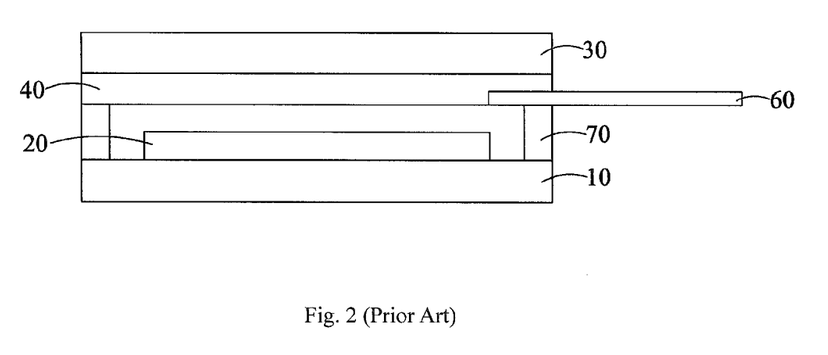
FIG. 2 illustratively shows another solution for integrating a touch component into an OLED panel.

As shown in FIG. 2, in accordance with the on-cell solution, a touch display panel includes a TFT substrate 10, an OLED element 20 formed on the TFT substrate 10, a package cover 30, a touch component 40 disposed under the package cover 30, an encapsulant 70 disposed between the TFT substrate 10 and the package cover 30 to adhere them hermetically, and a Flexible Printed Circuit Board (FPC) 60 electrically connected with the touch component 40. In such integration solution, the touch component 40 is integrated at the inside of the package cover, and thus this solution may reduce the thickness of the display panel as compared with the G/G solution. However, in this solution, the light emitted from the OLED element 20 is absorbed, reflected, refracted or interfered and so on when passing through the touch component 40, which results in poor display effect of the OLED display panel.

The in-cell capacitive touch panel may be realized by additionally adding touch scan lines and touch sensing lines directly on a TFT array substrate. Specifically, two layers of strip-shaped electrodes insulated from and intersected with each other are formed on the TFT array substrate, so as to serve as touch driving lines and touch sensing lines, respectively. A capacitor is formed at the intersection of the two stripes of electrodes, i.e., the two stripes of electrodes constitute two electrodes of the capacitor. When driving signals are applied on the touch driving lines, signals coupled from the touch sensing lines through a sensing capacitor are detected, and thus the values of capacitances at all intersections may be obtained. If a user's finger touches the touch panel, the coupling between two electrodes of the capacitor will be influenced and the value of the capacitance is changed, and thus the electrical signals coupled from the touch sensing lines are changed. According to the changes in the sensing signals, the touch position may be determined. Even if there are a plurality of touch positions, actual coordinates of each touch position can be computed. However, in the structure design of this type of in-cell capacitive touch panel, new films or layers need to be added on the existing TFT array substrate.

Thus, an in-cell touch display panel structure which may simplify the manufacturing process and/or have better display effect and/or better touch detection accuracy is needed.

The above information disclosed in the BACKGROUND is only for the purpose of facilitating understanding of the background of the present disclosure, and thus it may include information which does not constitute prior art known to one of ordinary skill in this art.

SUMMARY

The present disclosure discloses an in-cell touch display panel structure and a method for manufacturing the same, which may simplify the manufacturing process and/or have better display effect and/or better touch detection accuracy.

Other properties and advantages of the present disclosure will become clear through the following detailed description or may be learned partially by the practice of the present disclosure.

According to an aspect of the present disclosure, an OLED touch display panel may include a TFT array substrate, an OLED element and a touch array. The TFT array substrate may include: an active layer; a gate insulation layer covering the active layer; a gate line layer disposed on the gate insulation layer; an inter-layer insulation layer covering the gate line layer and the gate insulation layer; a data line layer disposed on the inter-layer insulation layer; and a planarizing layer covering the data line layer; wherein the gate line layer includes a gate line and a gate electrode, the data line layer includes a data line, a source electrode and a drain electrode, the gate line extends along a first direction, and the data line extends along a second direction intersecting with the first direction. The OLED element is formed on the TFT array substrate, and includes an upper electrode, a lower electrode, and an organic layer between the upper electrode and the lower electrode, wherein the lower electrode is electrically connected with the source electrode or the drain electrode via a first contact hole in the planarizing layer. The touch array may include: a first touch line extending along the first direction and disposed in the same layer with the gate line; a second touch line extending along the second direction, intersecting with the first touch line and disposed in the same layer with the data line; and a touch sensing electrode disposed in the same layer with the lower electrode of the OLED element, spaced from the lower electrode, and electrically connected with the second touch line via a second contact hole in the planarizing layer.

According to an exemplary embodiment, the lower electrode of the OLED element includes a bottom transparent conductive layer, a top transparent conductive layer, and a reflective layer between the bottom transparent conductive layer and the top transparent conductive layer, and the touch sensing electrode is disposed in the same layer with the bottom transparent conductive layer.

According to an exemplary embodiment, the touch sensing electrode and the bottom transparent conductive layer are formed of the same material.

According to an exemplary embodiment, the lower electrode of the OLED element has an ITO/Ag/ITO structure.

According to an exemplary embodiment, the first touch line and the gate line layer are formed of the same material.

According to an exemplary embodiment, the second touch line and the data line layer are formed of the same material.

According to an exemplary embodiment, the first touch line includes at least one first touch electrode, each of which has a width greater than a width of other part of the first touch line except the at least one first touch electrode.

According to an exemplary embodiment, the second touch line includes at least one second touch electrode, each of which has a width greater than a width of other part of the second touch line except the at least one second touch electrode.

According to an exemplary embodiment, the first touch line and the second touch line respectively have an increased width at an intersection of the first touch line and the second touch line.

According to an exemplary embodiment, the first touch line and/or the second touch line is formed of any one of Mo, Al, Ag, Au and Ti, or an alloy composed of at least two of them.

The touch display panels according to embodiments of the present disclosure at least have one of the following advantages. (1) The in-cell touch components may be manufactured in a TFT array substrate without introducing substantial changes to the existing manufacturing process. Thus, the process costs may be effectively lowered. (2) Because of the in-cell touch components, the thickness of the touch panel may be effectively reduced and thereby thinness may be realized. (3) Since absorption, reflection, refraction or interference of light will not occur, display effect of the OLED display panel is improved. (4) Since the touch sensing electrodes are closer to the outside surface of the touch panel and are disposed in the same layer of plane, the detection on touch may be more consistent and accurate.

BRIEF DESCRIPTION OF THE DRAWINGS

By the following detailed description of exemplary embodiments with reference to drawings, the above and other features and advantages of the present disclosure will become more apparent.

DETAILED DESCRIPTION

Now, exemplary embodiments will be described more fully with reference to drawings. However, the exemplary embodiments may be implemented in various manners, and shall not be interpreted as limited to the embodiments set forth herein; instead, providing these embodiments will make the present disclosure more comprehensive and complete and will fully convey the conception of the exemplary embodiments to one of ordinary skill in this art. In the drawings, thicknesses of regions and layers are exaggerated for clarity. Throughout the drawings, similar reference signs indicate the same or similar structures and their detailed description will be omitted.

In addition, the features, structures or characteristics described herein may be combined in one or more embodiments in any suitable manner. In the following description, many specific details are provided to allow sufficient understanding of the embodiments of the present disclosure. However, one of ordinary skill in this art will appreciate that the technical solutions in the present disclosure may be practiced without one or more of the specific details, or other methods, elements, materials and so on may be employed. In other cases, well-known structures, materials or operations are not shown or described in detail to avoid confusion of respective aspects of the present disclosure.

The present disclosure provides a new in-cell touch display panel structure which may simplify the manufacturing process and/or have better display effect and/or better touch detection accuracy, and may satisfy the thinness requirement of the touch display panel. The embodiments of the present disclosure will be described below with reference to the drawings.

The schematic structure and the manufacturing method of the capacitive in-cell OLED touch display panel 1000 according to an exemplary embodiment of the present disclosure will be described below with reference to FIG. 3.

Figure 3:
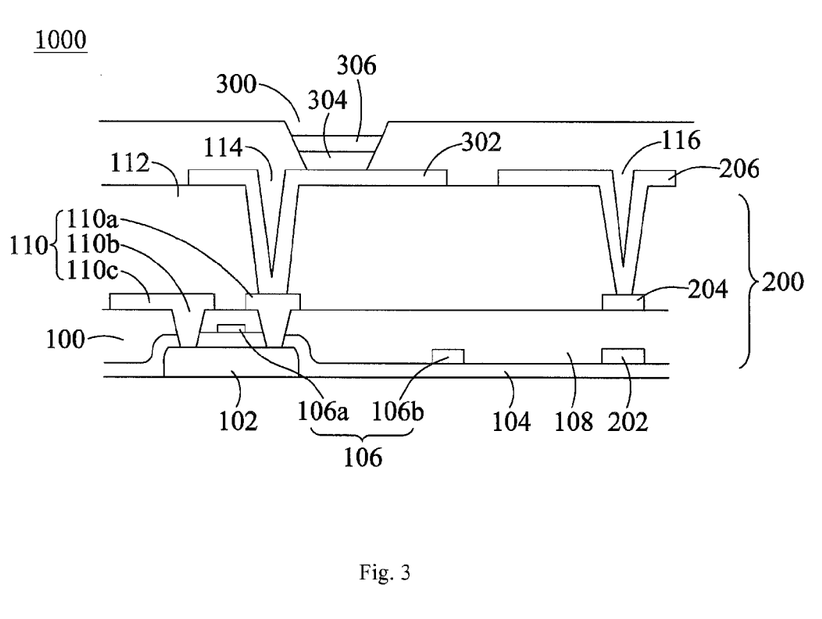
FIG. 3 illustratively shows a structure of a capacitive in-cell OLED touch display panel according to an exemplary embodiment of the present disclosure.

Referring to FIG. 3, the capacitive in-cell OLED touch display panel 1000 according to an exemplary embodiment of the present disclosure includes a TFT array substrate 100, a touch array 200 and an OLED element 300.

Referring to FIG. 3, the TFT array substrate 100 includes a substrate (not shown), an active layer 102 formed on the substrate, a gate insulation layer 104 covering the active layer 102, a gate line layer 106 disposed on the gate insulation layer 104, an inter-layer insulation layer 108 covering the gate line layer 106 and the gate insulation layer 104, a data line layer 110 disposed on the inter-layer insulation layer 108, and a planarizing layer 112 covering the data line layer 110.

The gate line layer 106 includes a gate line 106a and a gate electrode 106b extending from the gate line 106a. The data line layer 110 includes a data line 110c, a source electrode 110b and a drain electrode 110a. One of the source electrode 110b and the drain electrode 110a may extend from the data line 110*c*. The gate line 106*a* may extend along a first direction. The data line 110*c* may extend along a second direction intersecting with the first direction.

The OLED element 300 is formed on the TFT array substrate 100. The OLED element 300 may include a lower electrode 302, an upper electrode 306, and an organic layer 304 between the lower electrode 302 and the upper electrode 306. The lower electrode 302 is electrically connected with the source electrode 110*b* or the drain electrode 110*a* via a first contact hole 114 in the planarizing layer 112.

The touch display panel 1000 further includes a touch array 200. The touch array 200 includes a touch driving line 202, a touch sensing line 204 and a touch sensing electrode 206. The touch driving line 202 and the touch sensing line 204 have the similar structures and may realize interchangeable functions.

As shown in FIG. 3, the in-cell touch array 200 according to an embodiment of the present disclosure is disposed at a side portion but not a top portion of the OLED element 300, and thus the light emitted from the OLED element 300 is not absorbed, reflected, refracted or interfered since the light does not pass through the touch array 200. Consequently, the display effect of the OLED display panel 1000 is improved.

The touch driving line 202 extends along the first direction and is disposed in the same layer with the gate line 106*a*. The touch driving line 202 and the gate line layer 106 may be formed of the same material. The touch driving line 202 may be formed in the same process for forming the gate line 106*a* so as to be formed simultaneously with the gate line 106*a*. According to an exemplary embodiment, the touch driving line 202 and the gate line 106*a* are formed of any one of Mo, Al, Ag, Au and Ti, or an alloy composed of at least two of them.

According to an embodiment of the present disclosure, since the touch driving line 202 and the gate line 106*a* are disposed in the same layer, and they may be formed in the same manufacturing process, consequently, it is not necessary to change the existing process and thereby the manufacturing costs may be lowered.

The touch sensing line 204 extends along the second direction and intersects with the touch driving line 202. The touch sensing line 204 may be disposed in the same layer with the data line 110*c*. The touch sensing line 204 and the data line layer 110 may be formed of the same material. The touch sensing line 204 may be formed in the same process for forming the data line 110*c* so as to be formed simultaneously with the data line 110*c*. According to an exemplary embodiment, the touch sensing line 204 and the data line 110*c* may be formed of any one of Mo, Al, Ag, Au and Ti, or an alloy composed of at least two of them.

According to an embodiment of the present disclosure, since the touch sensing line 204 and the data line 110*c* are disposed in the same layer, and they may be formed in the same manufacturing process, consequently, it is not necessary to change the existing process and thereby the manufacturing costs may be lowered.

The touch sensing electrode 206 is disposed on the planarizing layer 112, and is electrically connected with the touch sensing electrode line 204 via a second contact hole 116 in the planarizing layer 112. The touch sensing electrode 206 and the lower electrode 302 of the OLED element 300 may be disposed in the same layer, and the touch sensing electrode 206 may be spaced from the lower electrode 302. The touch sensing electrode 206 may be formed in the same process for forming the lower electrode 302 so as to be formed simultaneously with the lower electrode 302. The touch sensing electrode 206 and the lower electrode 302 are insulated and spaced from each other and do not overlap with each other. The width of the touch sensing electrode 206 may be greater than a width of the touch sensing line 204 and the touch driving line 202.

According to an embodiment of the present disclosure, since the touch sensing electrode 206 and the lower electrode 302 are disposed in the same layer, and they may be formed in the same manufacturing process, consequently, it is not necessary to change the existing process and thereby the manufacturing costs may be lowered.

Further, since touch sensing electrodes are closer to the outside surface of the touch display panel, the accuracy of the touch detection may be improved by sensing a finger's touch through the touch sensing electrode.

Further, since the touch sensing electrodes are disposed in the same layer of plane, the distances from the touch sensing electrodes to the touching fingers are the same, and corresponding dielectric layer thickness and electrical parameters are the same, consequently, the detection on the touch may be more consistent and accurate.

Figure 4:
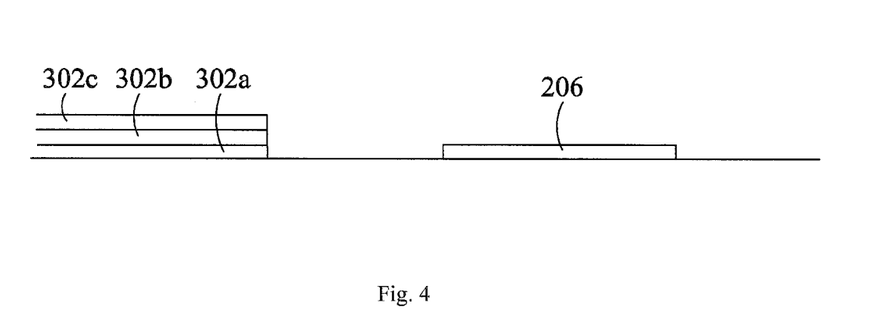
FIG. 4 illustratively shows a structure of an OLED lower electrode and a touch sensing electrode applied in a capacitive in-cell OLED touch display panel according to an exemplary embodiment of the present disclosure.

According to an embodiment, as shown in FIG. 4, the OLED lower electrode 302 includes a bottom transparent conductive layer 302*a*, a top transparent conductive layer 302*c*, and a reflective layer 302*b* between the bottom transparent conductive layer 302*a* and the top transparent conductive layer 302*c*. The touch sensing electrode 206 and the bottom transparent conductive layer 302*a* may be disposed in the same layer. The touch sensing electrode 206 and the bottom transparent conductive layer 302*a* may be formed of the same material. According to an exemplary embodiment, the touch sensing electrode 206 may be formed in the same process for forming the bottom transparent conductive layer 302*a* so as to be formed simultaneously with the bottom transparent conductive layer 302*a*. According to an exemplary embodiment, the lower electrode 302 may have an ITO/Ag/ITO structure, i.e., the bottom transparent conductive layer 302*a* and the top transparent conductive layer 302*c* are formed of ITO, and the reflective layer 302*b* is formed of Ag. In this case, the touch sensing electrode 206 and the bottom transparent conductive layer 302*a* may be formed of ITO in the same process.

Figure 5:
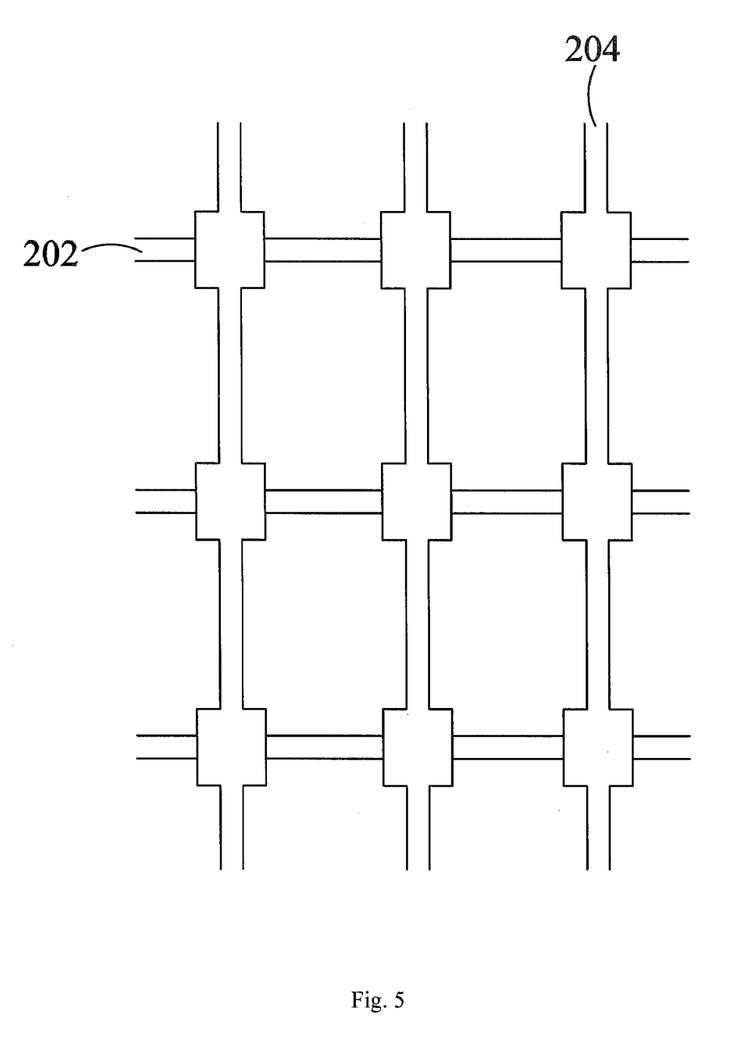
FIG. 5 illustratively shows a plan view of touch driving lines and touch sensing lines according to an exemplary embodiment of the present disclosure.

According to an exemplary embodiment, as shown in the schematic plan view in FIG. 5, the touch driving line 202 and the touch sensing line 204 respectively have an increased width at an intersection thereof, i.e., the width at the intersection is greater than the width away from the intersection. Thus, the overlapped area of the touch driving line 202 and the touch sensing line 204 may be increased, and thereby the mutual capacitance of the touch driving line 202 and the touch sensing line 204 at the intersection may be increased.

Figure 6:
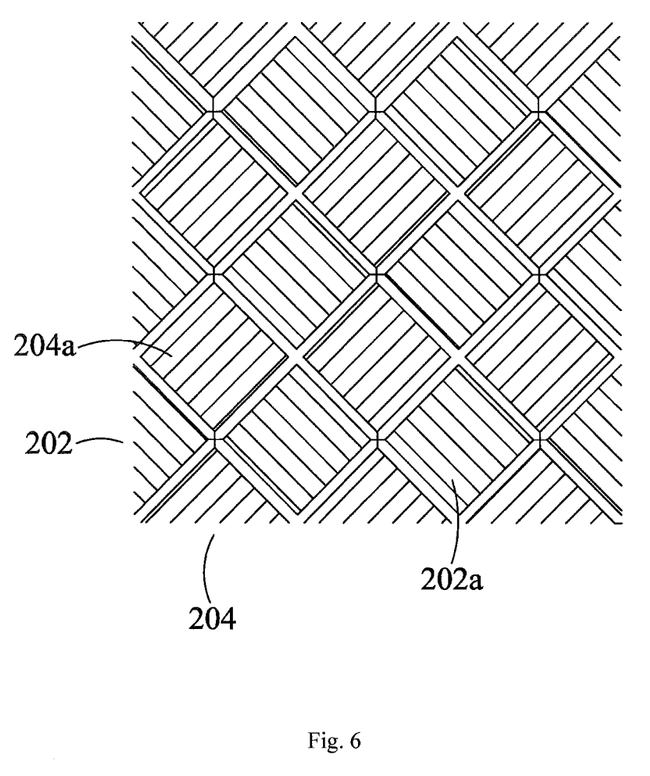
FIG. 6 illustratively shows a plan view of touch driving lines and touch sensing lines according to an exemplary embodiment of the present disclosure.
Figure 7:
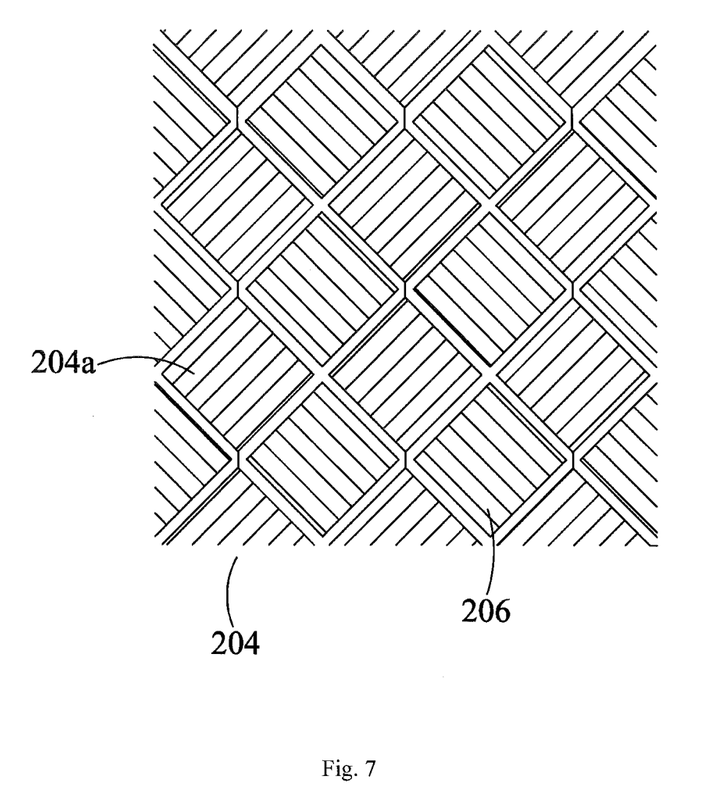
FIG. 7 illustratively shows a plan view of touch sensing lines and touch sensing electrodes according to an exemplary embodiment of the present disclosure.

According to an exemplary embodiment, as shown in the schematic plan view in FIG. 6, the touch driving line 202 includes at least one touch electrode 202*a*. The touch electrode 202*a* has an increased width, i.e., the width of the touch electrode 202*a* is greater than the width of the touch driving line 202 away from the touch electrode 202*a*. The touch sensing line 204 include at least one touch electrode 204*a*. The touch electrode 204*a* has an increased width, i.e., the width of the touch electrode 204*a* is greater than the width of the touch sensing line 204 away from the touch electrode 204*a*. Thus, the coupling capacitance may be increased, and the sensitivity of touch detection may be increased. However, the present disclosure is not limited to this. For example, only one of the touch electrodes 202*a* and 204*a* may be employed. As another example, only one of the touch electrodes 202*a* and 204*a* may be employed, and the touch sensing electrode 206 may be made to correspond in function and shape to the other one of the touch electrodes 202a and 204a, as shown in FIG. 7.

As described above, the touch display panels according to embodiments of the present disclosure at least have one of the following advantages:

(1) The in-cell touch components may be manufactured in a TFT array substrate without introducing substantial changes to the existing manufacturing process. Thus, the process costs may be effectively lowered.

(2) Because of the in-cell touch components, the thickness of the touch panel may be effectively reduced and thereby thinness may be realized.

(3) Since absorption, reflection, refraction or interference of light will not occur, display effect of the OLED display panel is improved.

(4) Since the touch sensing electrodes are closer to the outside surface of the touch panel and are disposed in the same layer of plane, the detection on touch may be more consistent and accurate.

The exemplary embodiments of the present disclosure are shown and described above in detail. It shall be appreciated that the present disclosure is not limited to the disclosed embodiments, and instead, the present disclosure intends to encompass various modifications and equivalent arrangements within the spirit and scope of the appended claims.

What is claimed is:

1. An Organic Light Emitting Diode (OLED) touch display panel, comprising:
   a Thin Film Transistor (TFT) array substrate, comprising:
      an active layer;
      a gate insulation layer covering the active layer;
      a gate line layer disposed on the gate insulation layer;
      an inter-layer insulation layer covering the gate line layer and the gate insulation layer;
      a data line layer disposed on the inter-layer insulation layer; and
      a planarizing layer covering the data line layer;
      wherein the gate line layer comprises a gate line and a gate electrode, the data line layer comprises a data line, a source electrode and a drain electrode, the gate line extends along a first direction, and the data line extends along a second direction intersecting with the first direction;
   an OLED element formed on the TFT array substrate and comprising an upper electrode, a lower electrode and an organic layer between the upper electrode and the lower electrode, wherein the lower electrode is electrically connected with the source electrode or the drain electrode via a first contact hole in the planarizing layer;
   a first touch line extending along the first direction and disposed in the same layer with the gate line;
   a second touch line extending along the second direction, intersecting with the first touch line and disposed in the same layer with the data line; and
   a touch sensing electrode disposed in the same layer with the lower electrode of the OLED element, spaced from the lower electrode and electrically connected with the second touch line via a second contact hole in the planarizing layer.

2. The OLED touch display panel according to claim 1, wherein the lower electrode of the OLED element comprises a bottom transparent conductive layer, a top transparent conductive layer, and a reflective layer between the bottom transparent conductive layer and the top transparent conductive layer, and the touch sensing electrode is disposed in the same layer with the bottom transparent conductive layer.

3. The OLED touch display panel according to claim 2, wherein the touch sensing electrode and the bottom transparent conductive layer are formed of the same material.

4. The OLED touch display panel according to claim 3, wherein the lower electrode of the OLED element comprises an ITO/Ag/ITO structure.

5. The OLED touch display panel according to claim 1, wherein the first touch line and the gate line layer are formed of the same material.

6. The OLED touch display panel according to claim 5, wherein the second touch line and the data line layer are formed of the same material.

7. The OLED touch display panel according to claim 1, wherein the first touch line comprises at least one first touch electrode, each of which has a width greater than a width of rest of the first touch line.

8. The OLED touch display panel according to claim 7, wherein the second touch line comprises at least one second touch electrode, each of which has a width greater than a width of rest of the second touch line.

9. The OLED touch display panel according to claim 1, wherein the first touch line and the second touch line respectively have an increased width at an intersection of the first touch line and the second touch line.

10. The OLED touch display panel according to claim 5, wherein the first touch line and/or the second touch line is formed of any one of Mo, Al, Ag, Au and Ti, or an alloy composed of at least two of them.

11. The OLED touch display panel according to claim 6, wherein the first touch line and/or the second touch line is formed of any one of Mo, Al, Ag, Au and Ti, or an alloy composed of at least two of them.

* * * * *